United States Patent
Masuda et al.

(10) Patent No.: US 9,252,513 B2
(45) Date of Patent: Feb. 2, 2016

(54) SOCKET AND ELECTRONIC COMPONENT MOUNTING STRUCTURE

(71) Applicant: FUJITSU LIMITED, Kawasaki-shi, Kanagawa (JP)

(72) Inventors: Yasushi Masuda, Kawasaki (JP); Akira Tamura, Yokohama (JP); Yoshihiro Morita, Yokohama (JP); Satoshi Ohsawa, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 165 days.

(21) Appl. No.: 14/088,902

(22) Filed: Nov. 25, 2013

(65) Prior Publication Data

US 2014/0154925 A1 Jun. 5, 2014

(30) Foreign Application Priority Data

Dec. 3, 2012 (JP) ................................ 2012-264276

(51) Int. Cl.
   *H01R 31/06* (2006.01)
   *H05K 1/11* (2006.01)
   *H01R 12/71* (2011.01)
   *H05K 7/10* (2006.01)

(52) U.S. Cl.
   CPC ............ *H01R 12/714* (2013.01); *H05K 7/1069* (2013.01)

(58) Field of Classification Search
   CPC ....... H01R 23/72; H01R 23/722; H01R 9/096
   USPC .................................... 439/66, 628
   See application file for complete search history.

(56) References Cited

U.S. PATENT DOCUMENTS

| | | | |
|---|---|---|---|
| 5,302,853 A | | 4/1994 | Volz et al. |
| 5,893,761 A | * | 4/1999 | Longueville ................... 439/66 |
| 5,938,451 A | * | 8/1999 | Rathburn ........................ 439/66 |
| 5,967,797 A | * | 10/1999 | Maldonado ..................... 439/66 |
| 6,146,151 A | * | 11/2000 | Li ..................................... 439/66 |
| 6,416,331 B1 | * | 7/2002 | Shimizu .......................... 439/66 |
| 6,790,057 B2 | * | 9/2004 | DelPrete et al. ................ 439/91 |
| 6,945,788 B2 | * | 9/2005 | Trout et al. ..................... 439/66 |
| 6,957,963 B2 | * | 10/2005 | Rathburn ........................ 439/66 |
| 7,070,420 B1 | * | 7/2006 | Wakefield et al. .............. 439/66 |
| 7,371,073 B2 | * | 5/2008 | Williams ........................ 439/66 |
| 7,448,877 B1 | * | 11/2008 | Pennypacker et al. .......... 439/66 |
| 7,722,360 B2 | * | 5/2010 | Millard et al. .................. 439/66 |
| 7,748,991 B2 | * | 7/2010 | Nikaido et al. ................. 439/71 |

(Continued)

FOREIGN PATENT DOCUMENTS

| | | |
|---|---|---|
| JP | 06-244322 | 9/1994 |
| JP | 2008-111722 | 5/2008 |

*Primary Examiner* — Briggitte R Hammond
(74) *Attorney, Agent, or Firm* — Staas & Halsey LLP

(57) ABSTRACT

A socket includes a plurality of coupling members that each include a first end portion and a second end portion, the coupling members being made of electrically conductive material, wherein a terminal of an electronic component and a terminal of a board are electrically coupled with the first end portion and the second end portion, respectively, so to electrically connect the terminal of the electronic component and the terminal of the board, a holding member that holds the plurality of coupling members in such a manner that the plurality of coupling members are not in contact with each other, the holding member being made form an electrical insulating material, and a sheet member that is in contact with the electronic component and the board in parts between the plurality of coupling members, the sheet member being made from a material which is electrical insulating and thermal diffusive.

17 Claims, 13 Drawing Sheets

(56) References Cited

U.S. PATENT DOCUMENTS

| | | | |
|---|---|---|---|
| 8,007,287 B1 * | 8/2011 | Champion et al. | 439/66 |
| 8,070,496 B2 * | 12/2011 | Li et al. | 439/66 |
| 8,641,428 B2 * | 2/2014 | Light et al. | 439/66 |
| 8,832,936 B2 * | 9/2014 | Hougham et al. | 29/884 |
| 2009/0325398 A1 * | 12/2009 | Ma et al. | 439/66 |
| 2010/0072587 A1 | 3/2010 | Naito | |
| 2011/0003488 A1 * | 1/2011 | Tamura | 439/66 |
| 2011/0059631 A1 * | 3/2011 | Tamura | 439/66 |

* cited by examiner

SOCKET AND ELECTRONIC COMPONENT MOUNTING STRUCTURE

CROSS-REFERENCE TO RELATED APPLICATION

This application is based upon and claims the benefit of priority of the prior Japanese Patent Application No. 2012-264276, filed on Dec. 3, 2012, the entire contents of which are incorporated herein by reference.

FIELD

The embodiment discussed herein is related to a socket and an electronic component mounting structure.

BACKGROUND

In a structure in which an electronic component is mounted on a board, a structure in which a socket is interposed between the board and the electronic component is sometimes used.

For example, a structure is known in which contact pins electrically connected to an electronic component and contact pins not electrically connected to the electronic component pass through receiving holes formed in a heat spreader on a socket main body, and a new heat radiation pathway is thereby formed.

A related art is disclosed in Japanese Laid-open Patent Publication No. 2008-111722.

SUMMARY

According to an aspect of the invention, a socket includes a plurality of coupling members that each include a first end portion and a second end portion, the coupling members being made of electrically conductive material, wherein a terminal of an electronic component and a terminal of a board are electrically coupled with the first end portion and the second end portion, respectively, so to electrically connect the terminal of the electronic component and the terminal of the board, a holding member that holds the plurality of coupling members in such a manner that the plurality of coupling members are not in contact with each other, the holding member being made form an electrical insulating material, and a sheet member that is in contact with the electronic component and the board in parts between the plurality of coupling members, the sheet member being made from a material which is electrical insulating and thermal diffusive.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

Preliminary Consideration

In a conventional structure in which an electronic component is mounted on a board, it is sometimes difficult to efficiently radiate heat from the board-side surface of the electronic component.

Accordingly, it is desired to make it possible to efficiently radiate heat, in a structure in which an electronic component is mounted on a board, from the board-side surface of the electronic component.

A first embodiment will be described with reference to the drawings in detail.

Figure 3:
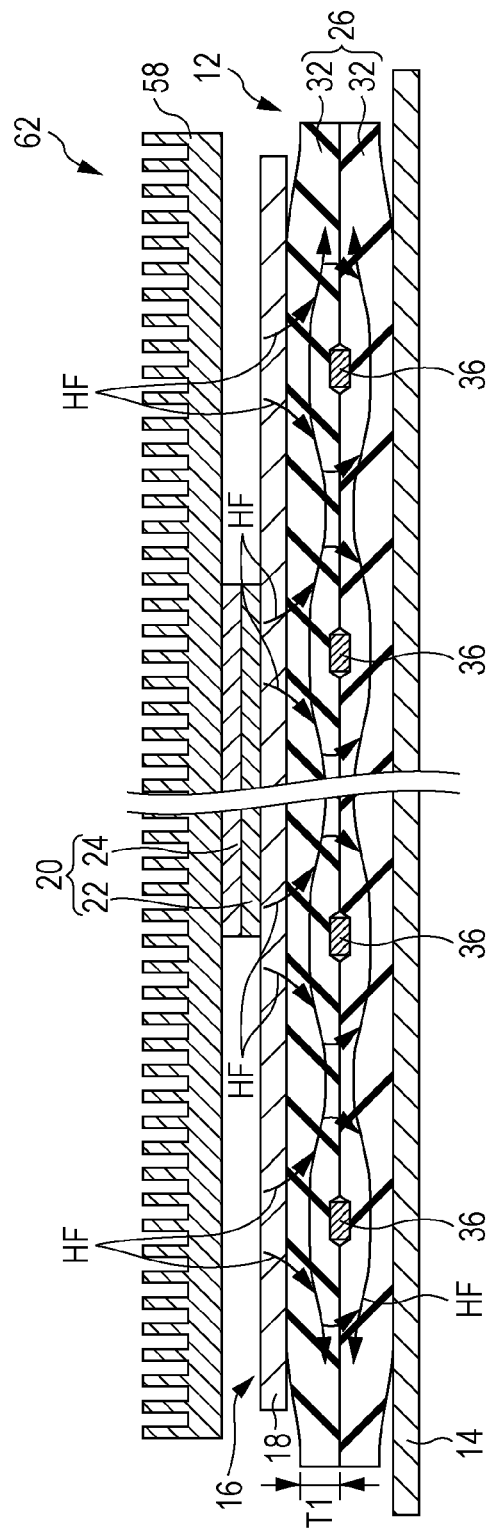
FIG. 3 is a sectional view illustrating an electronic component mounting structure of the first embodiment using a section of the socket taken along line III-III in FIG. 2.

As illustrated in FIG. 3, a socket 12 used in an electronic component mounting structure 62 of the first embodiment is a member that, in a structure in which an electronic component 16 is mounted on a board 14, electrically connects the board 14 and the electronic component 16. The electronic component 16 of this embodiment includes a structure in which a plurality of laminated components 20 (a logic circuit section 22 and a memory section 24 in the illustrated example) are stacked onto a flat plate-like package substrate 18.

Figure 2:
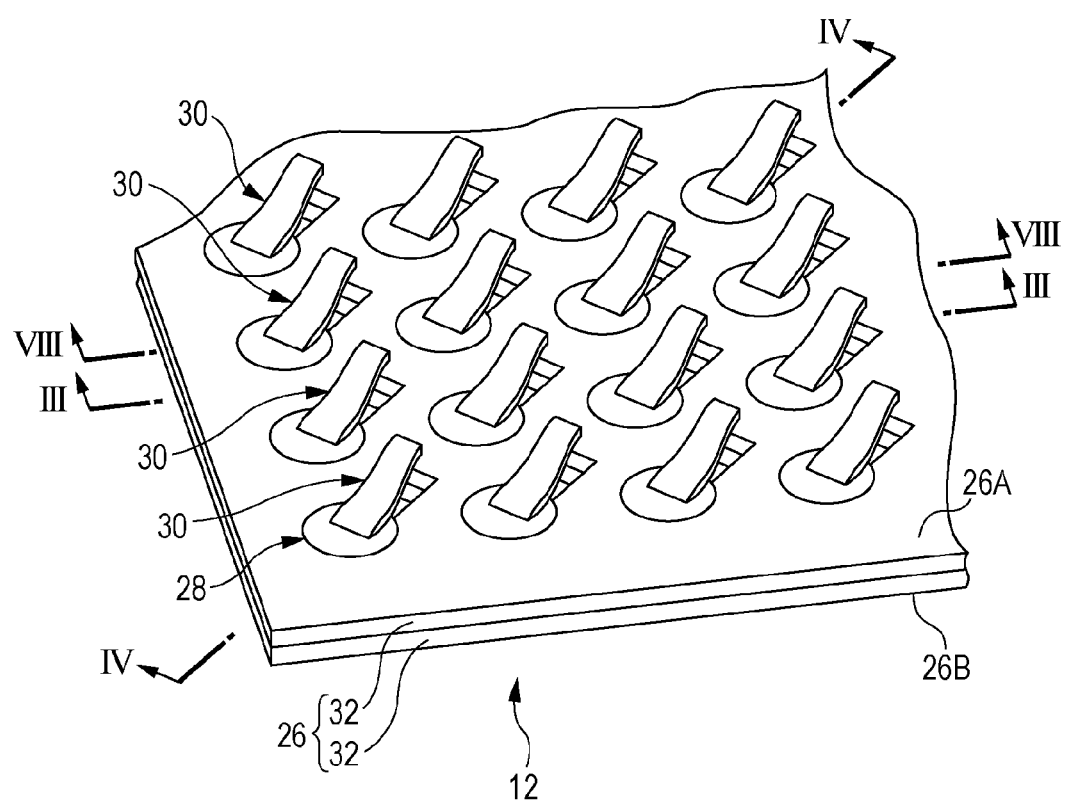
FIG. 2 is a partial enlarged perspective view illustrating the socket of the first embodiment.

FIG. 3 is a sectional view illustrating the electronic component mounting structure 62 and illustrates a cross-section of the socket 12 taken along line III-III in FIG. 2.

Figure 1:
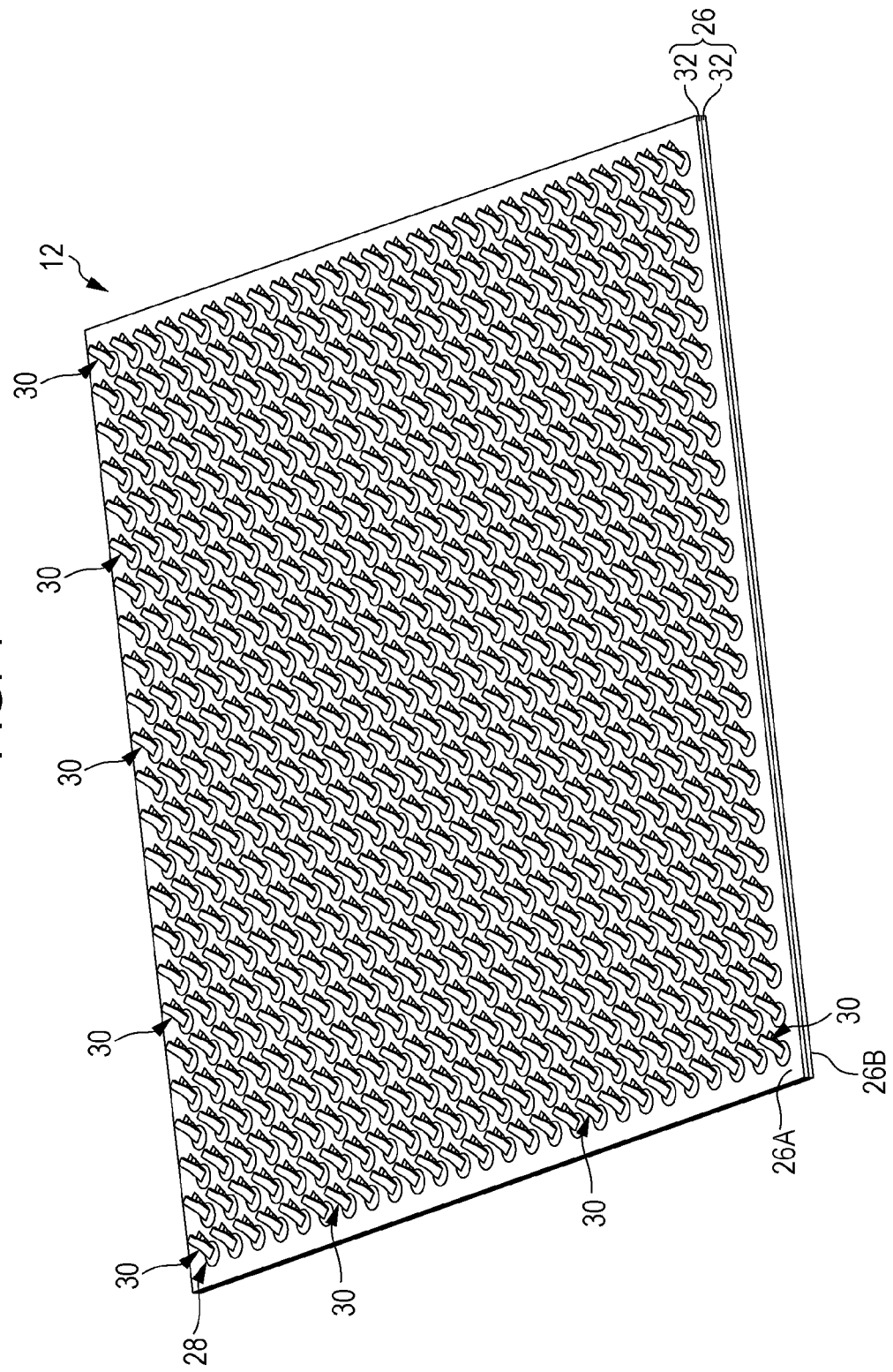
FIG. 1 is a perspective view illustrating a socket of a first embodiment.

As illustrated in FIG. 1 and FIG. 2, the socket 12 includes a sheet member 26, a holding member 28, and coupling members 30. Hereinafter, the two sides of the sheet member 26 will be referred to as an upper side 26A and a lower side 26B. However, there is no particular difference in structure between the upper side 26A and the lower side 26B.

In this embodiment, the sheet member 26 includes two unitary sheets 32 having the similar shape (a substantially rectangular parallelepiped shape). The unitary sheets 32 are superimposed on each other to form the sheet member 26.

The unitary sheets 32 are formed of a material having an electrical insulation property and a thermal diffusion property, in a substantially rectangular sheet-like shape. The "electrical insulation property" means a resistivity of 1000

MΩm or more. The "thermal diffusion property" means a thermal conductivity of 5 W/m·K or more.

An example of the unitary sheet 32 is a heat radiation sheet manufactured by Oki Electric Industry Co., Ltd. (under the trade name of "MAZUHARU ICHIBAN"). The thickness T1 of the unitary sheets 32 is, for example, about 0.3 mm. Thereby, the unitary sheets 32 have flexibility, and the sheet member 26 also has flexibility. The thickness T2 of the sheet member 26 is two times the thickness of the unitary sheets 32 (about 0.6 mm in the above example). While the unitary sheets 32 have a high electrical insulation property and a high thermal diffusion property, the unitary sheets 32 desirably have a higher stiffness in order to hold the coupling members 30 of the socket 12.

Figure 4:
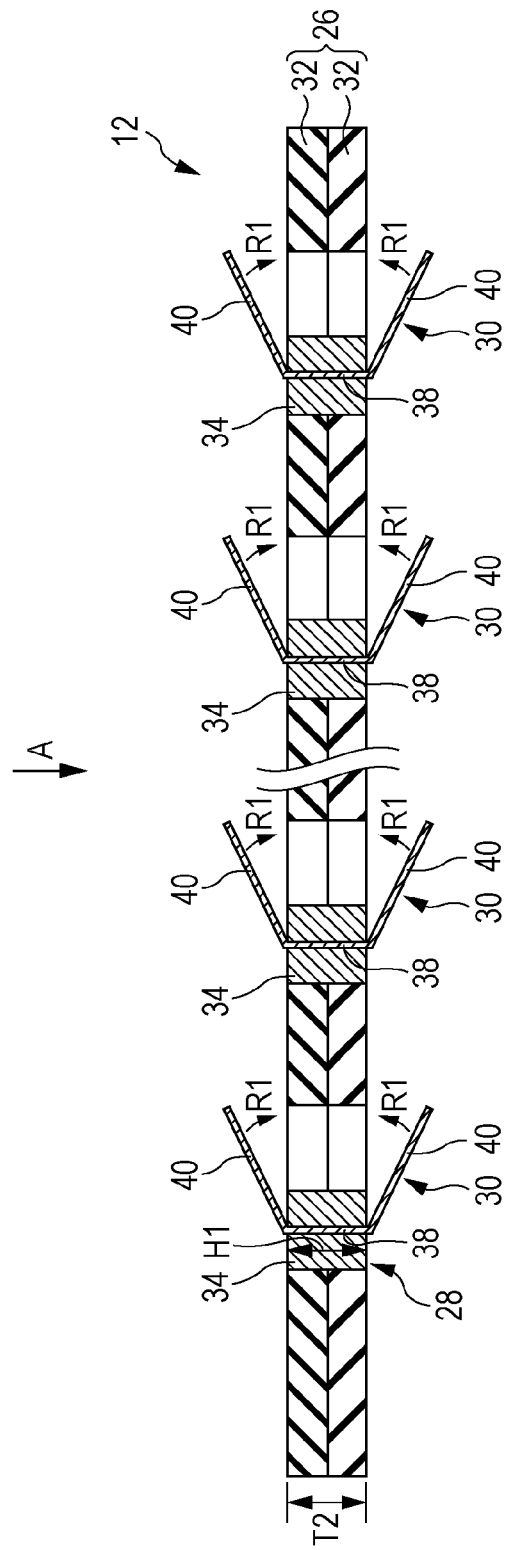
FIG. 4 is a sectional view taken along line IV-IV in FIG. 2 illustrating the socket of the first embodiment.
Figure 5:
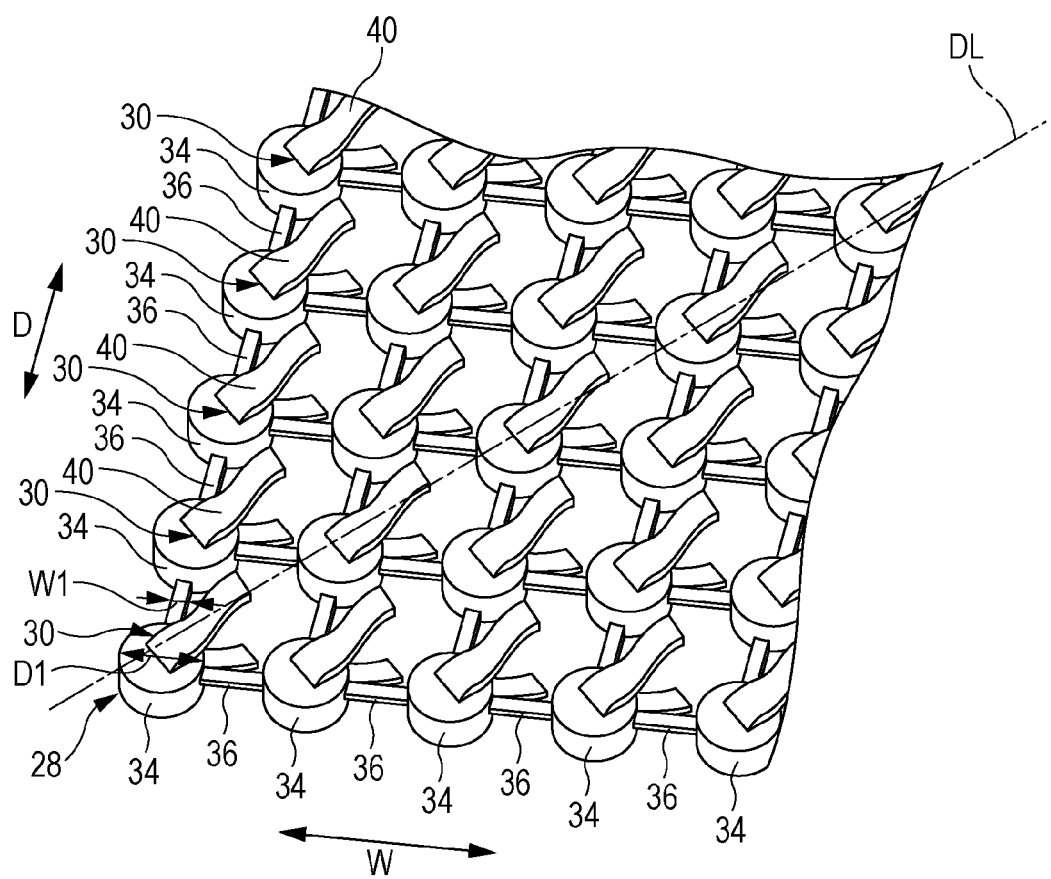
FIG. 5 is a partial enlarged perspective view illustrating a holding member and coupling members of the socket of the first embodiment.

As illustrated in FIG. 4 and FIG. 5 in detail, the holding member 28 includes a plurality of block portions 34. In this embodiment, each of the block portions 34 is formed in a cylindrical shape having a height H1 about equal to the thickness T2 of the sheet member 26. The plurality of block portions 34 are connected to each other by stick-like connecting members 36 in the width direction (the direction of arrow W) and the depth direction (the direction of arrow D), and the holding member 28 thereby includes a lattice-like structure. The width W1 of the connecting members 36 is less than the external diameter D1 of the block portions 34.

The block portions 34 are located at the intersections of the lattice, and the relative positions of the block portions 34 are maintained by the holding members 28. The entire area of the holding member 28 in plan view (the view from the direction of arrow A illustrated in FIG. 4) is less than the area of the sheet member 26 in plan view. As will be described later, each of the block portions 34 is shaped such that the characteristic impedance is matched in order to improve the transmission characteristic (the capacity to transmit a signal while suppressing the decay and degradation of the signal) when the board 14 and the electronic component 16 are connected by the coupling members 30.

One of the coupling members 30 passes through each of the block portions 34. The coupling members 30 are formed of a material having a conductive property, for example, metal such as copper, in an elongated shape. The longitudinally central part of each coupling member 30 is an embedded portion 38 embedded and fixed in the corresponding block portion 34.

A method for embedding the embedded portion 38 in the block portion 34 includes forming an insertion hole into which the coupling member 30 is inserted in the block portion 34 and press-fitting the coupling member 30 into the insertion hole. Alternatively, a method including, before forming the holding member 28 using a mold, inserting the coupling members 30 in predetermined positions in the mold, and then forming the holding member 28 (so-called insert molding) may be used.

Figure 9:
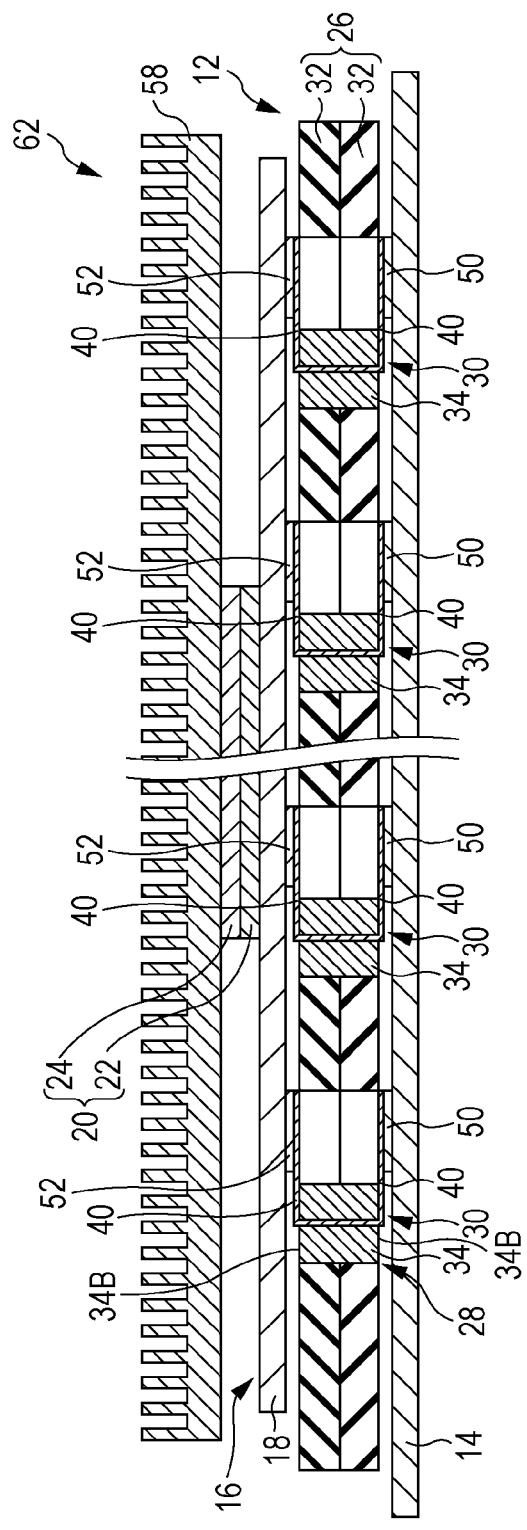
FIG. 9 is a sectional view illustrating an embodiment of the electronic component mounting structure using the socket of the first embodiment using the same section of the socket as FIG. 4.

Both longitudinal end parts (parts other than the embedded portion 38) of each coupling member 30 are extending portions 40 extending at an angle to the two bottom surfaces 34B of the corresponding block portion 34. Each extending portion 40 comes into contact with a contact portion 50 of the board 14 or a contact portion 52 of the electronic component 16 as will be described later. However, the shape of the extending portions 40 is determined such that the extending portions 40 do not come into contact with those of another coupling member 30 even when the extending portions 40 are parallel to the bottom surfaces 34B as illustrated in FIG. 9. Therefore, the plurality of coupling members 30 maintain the positions of intersections of the lattice of the holding member 28, and are connected so as not to be in contact with each other.

In this embodiment, the extending portions 40 extend in a direction along the diagonal line DL of the lattice in plan view of the holding member 28 as illustrated in FIG. 5. That is, in plan view, the extending portions 40 exist at positions different from the positions of the connecting members 36 of the holding member 28.

Figure 6:
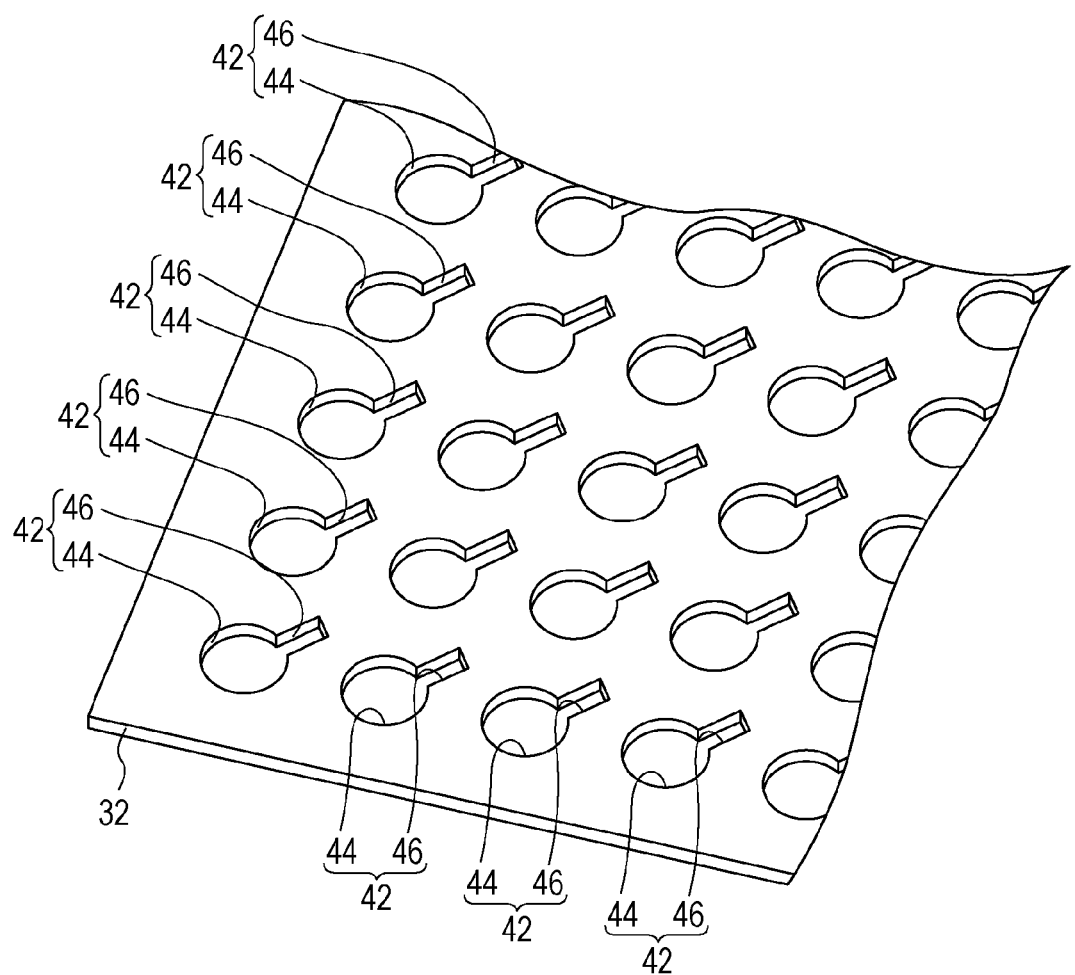
FIG. 6 is a partial enlarged perspective view illustrating a unitary sheet of the socket of the first embodiment.

As illustrated in FIG. 6, the same number of through-holes 42 as the number of the block portions 34 are formed in each of the unitary sheets 32. The through-holes 42 include, at positions corresponding to the block portion 34, circular portions 44 formed in a circular shape in plan view so that the block portions 34 may be housed within the through-holes 42.

In addition, the through-holes 42 each include a substantially quadrilateral expanded diameter portion 46 partly expanded radially outward from the circular portion 44. The expanded diameter portion 46 is formed in a position and shape corresponding to the extending portion 40 of the coupling member 30. Further, the expanded diameter portion 46 is formed in such a position and shape that the extending portion 40 may pass through the expanded diameter portion 46.

Figure 7:
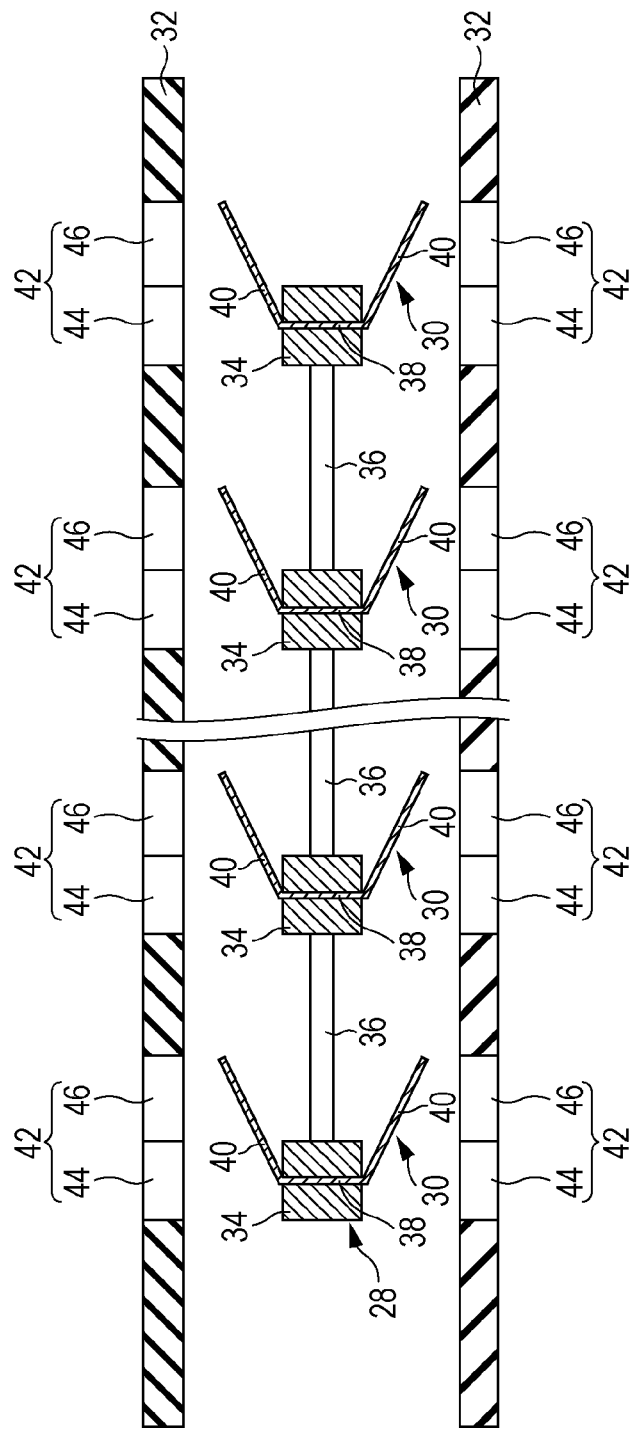
FIG. 7 is a sectional view illustrating the socket of the first embodiment in the process of manufacturing using the same section as FIG. 4.

Therefore, in the process for manufacturing the socket 12, as illustrated in FIG. 7, the holding member 28 in which the plurality of coupling members 30 are attached to the block portions 34 may be sandwiched between the unitary sheets 32 from both sides in the thickness direction. At this time, the block portions 34 pass through the circular portions 44 of the through-holes 42, and the extending portions 40 of the coupling members 30 pass through the expanded diameter portions 46. In places where the connecting portions 36 do not exist when the holding member 28 is viewed in the direction of arrow A illustrated in FIG. 4, the two unitary sheets 32 are in close contact with each other as illustrated in FIG. 4. In other words, the two unitary sheets 32 are attached to both sides of the lattice-shaped holding member 28 to form the sheet member 26.

The height of the block portions 34 is about equal to the thickness T2 of the sheet member 26. Therefore, the bottom surfaces 34B of the block portions 34 are coplanar with the upper side 26A or the lower side 26B of the sheet member 26 and are exposed.

Figure 8:
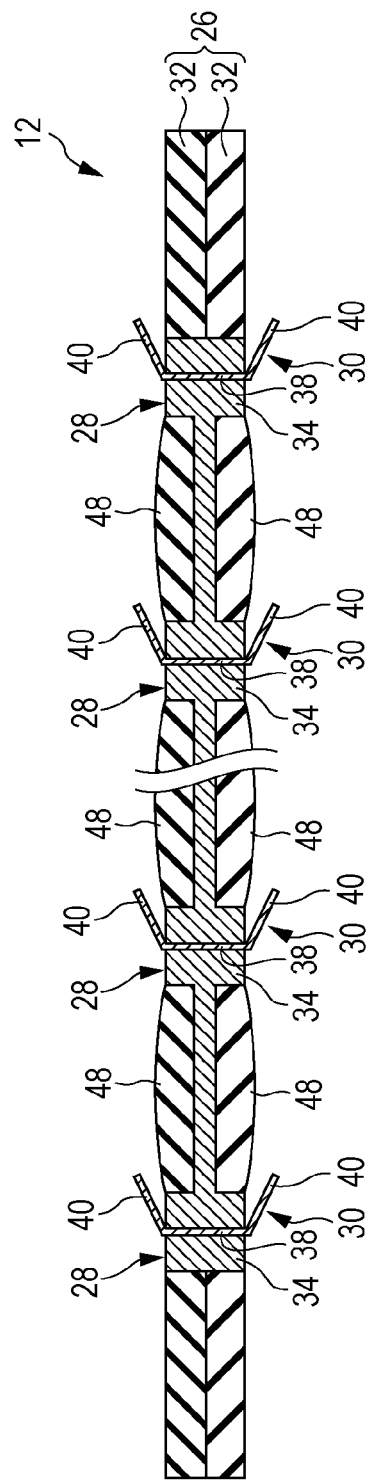
FIG. 8 is a sectional view taken along line VIII-VIII in FIG. 2 illustrating the socket of the first embodiment.

As may be seen from FIG. 8, in places where the connecting portions 36 exist, the unitary sheets 32 are in contact with the connecting portions 36. Therefore, in the positions of the connecting portions 36, the sheet member 26 partly bulges outward in the thickness direction to form bulging portions 48. Specifically, the upper unitary sheet 32 in FIG. 8 bulges upward to form bulging portions 48 in places where the connecting portions 36 exist. The lower unitary sheet 32 bulges downward to form bulging portions 48 in places where the connecting portions 36 exist.

The socket 12 is formed in this way. The bottom surfaces 34B of the block portions 34 are exposed on both sides in the thickness direction of the sheet member 26. From the bottom surfaces 34B, the extending portions 40 extend at an angle to the bottom surfaces 34B. That is, the plurality of coupling members 30 continuously extend from the upper side 26A to the lower side 26B of the sheet member 26.

Since the extending portions 40 are made of metal, when they are subjected to a force from above or below, they may bend in the direction of arrow R1 (see FIG. 4) so as to rotate toward the upper side 26A or the lower side 26B. In particular, when the coupling members 30 connect the board 14 and the electronic component 16 between the board 14 and the electronic component 16, the extending portions 40 are in contact with the unitary sheets 32. The two extending portions 40 of each coupling member 30 are parallel to each other.

Figure 10:
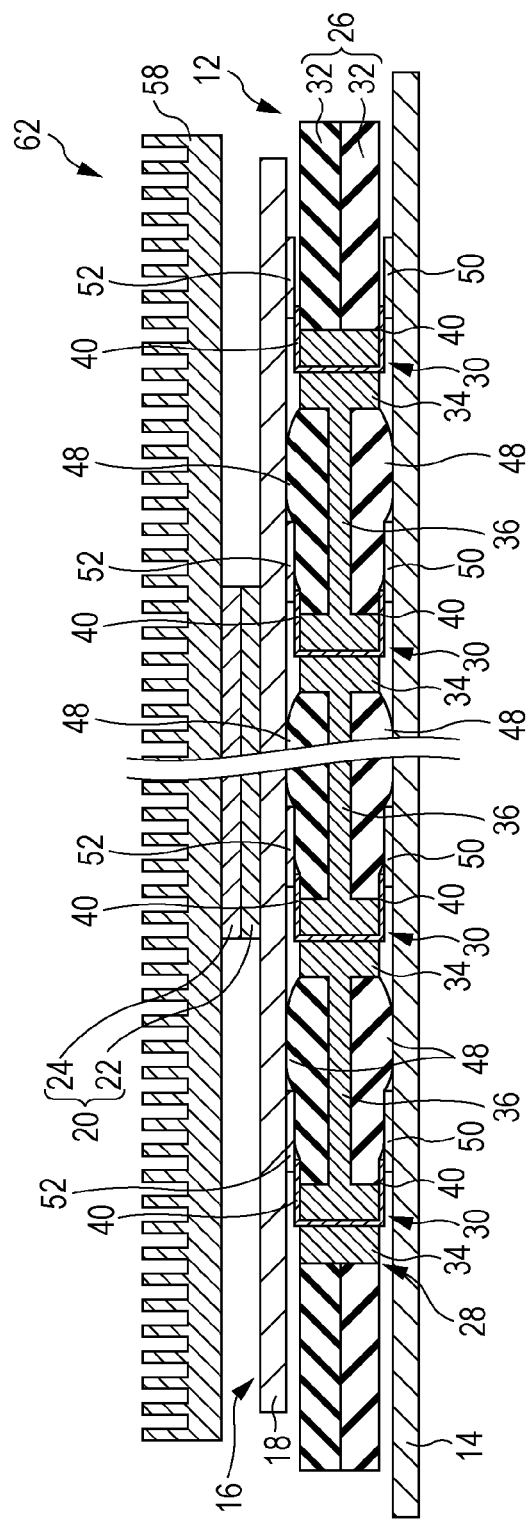
FIG. 10 is a sectional view illustrating the electronic component mounting structure of the embodiment using the same section of the socket as FIG. 8.

As illustrated in FIG. 3, FIG. 9, and FIG. 10, in the electronic component mounting structure 62 employing the socket 12 of the first embodiment, the electronic component 16 is electrically connected to the board 14 by the socket 12. At this time, the socket 12 is sandwiched and pressed between the board 14 and the electronic component 16 in the thickness direction. The extending portions 40 on the board 14 side come into contact with the contact portions 50 on the board 14. The extending portions 40 on the electronic component 16 side come into contact with the contact portions 52 of the package substrate 18.

Thereby, the electronic component 16 and the board 14 are electrically connected by the coupling members 30. The coupling members 30 are fixed to the block portions 34, and the block portions 34 are connected by the connecting portions 36 and maintain their relative positions. Therefore, inadvertent contact between the extending portions 40 is suppressed.

In addition, the characteristic impedance of the block portions 34 is matched. Therefore, the transmission characteristic when the board 14 and the electronic component 16 are connected by the coupling members 30 is better compared to a structure in which the characteristic impedance is not matched.

In order to better maintain the contact between the extending portions 40 of the coupling members 30 and the contact portions 50 and 52 of the electronic component 16 and the board 14, as occasion calls, the extending portions 40 and the contact portions 50 and 52 are joined by soldering. Instead of soldering, they may be bonded with an electrically-conductive adhesive.

Figure 11:
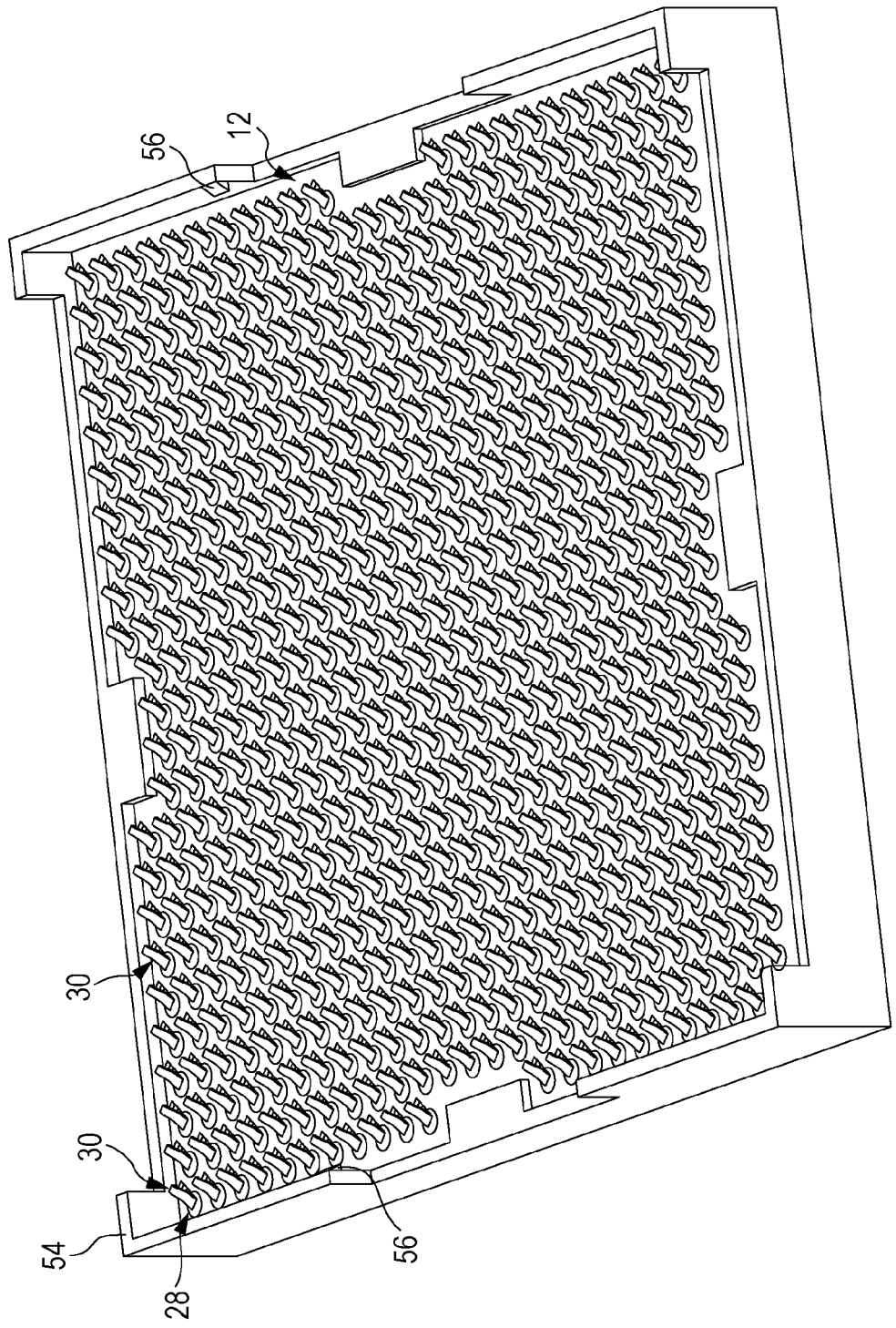
FIG. 11 is a perspective view illustrating the socket of the first embodiment housed within a frame body.

As illustrated in FIG. 11, the socket 12 may be housed within a frame body 54. At predetermined positions of the frame body 54, claw portions 56 are formed. The board 14 and the electronic component 16 may be engaged with the claw portions 56 so that the contact between the extending portions 40 and the contact portions 50 and 52 may be better maintained.

As illustrated in FIG. 3 and FIG. 10, the upper unitary sheet 32 of the sheet member 26 is in contact with the package substrate 18. Therefore, heat transfer pathways (thermal diffusion pathways) HF through which heat is transferred from the package substrate 18 to the sheet member 26 are formed. That is, compared to a structure in which part of the sheet member 26 is not in contact with the package substrate 18, heat is easily diffused from the board 14 side of the package substrate 18, and efficient heat radiation is possible.

In particular, in this embodiment, bulging portions 48 (see FIG. 8) are formed in the sheet member 26. Since the bulging portions 48 are bulging toward the electronic component 16 as illustrated in FIG. 10, the contact with the electronic component 16 may be better maintained compared to a structure in which such bulging portions 48 are not formed.

In this embodiment, as illustrated in FIG. 3 and FIG. 9, the two unitary sheets 32 are in contact with each other in places where the connecting portions 36 do not exist. Therefore, heat diffused from the package substrate 18 to the upper unitary sheet 32 is also diffused to the lower unitary sheet 32. Therefore, compared to a structure in which the two unitary sheets 32 are not in contact with each other, more efficient heat radiation is possible.

In particular, in this embodiment, as may be seen from FIG. 5, the extending portions 40 exist at positions different from the positions of the connecting portions 36 of the holding member 28 in plan view of the holding member 28, that is, along the diagonal line DL. Since the extending portions 40 are not located between the bulging portions 48 and the package substrate 18, a larger contact area between the sheet member 26 and the package substrate 18 may be secured.

In addition, in this embodiment, as illustrated in FIG. 3, FIG. 9, and FIG. 10, a heat sink 58 is disposed in contact with the laminated component 20 (the memory section 24) of the electronic component 16. Therefore, the heat of the memory section 24 is diffused from the heat sink 58. That is, the heat of the package substrate 18 of the electronic component 16 may be radiated by the sheet member 26, and the heat of the memory section 24 may be radiated by the heat sink 58.

The heat sink 58 is an example of a heat radiating member, and the heat radiating member is not limited to a heat sink 58 as long as it may effectively radiate heat from the laminated components 20.

In addition, in this embodiment, the board 14 and the electronic component 16 are electrically connected by the extending portions 40 extending from both sides of the sheet member 26. The substantial height of the coupling members 30 is substantially equal to the thickness of the sheet member 26.

Consider a socket having a structure in which, unlike the socket 12 of the above embodiment, pins having a high stiffness are protruded from both sides of a plate-like member. In the case of such a structure, the pins abut a board and an electronic component, therefore the height of the socket is large, and therefore the transmission loss of electrical signal is large. In contrast, in this embodiment, the distance between the extending portions 40 on the upper side 26A and the extending portions 40 on the lower side 26B is small. Therefore, the transmission loss in the electrical connection between the board 14 and the electronic component 16 is small, and the transmission characteristic is better.

Figure 12:
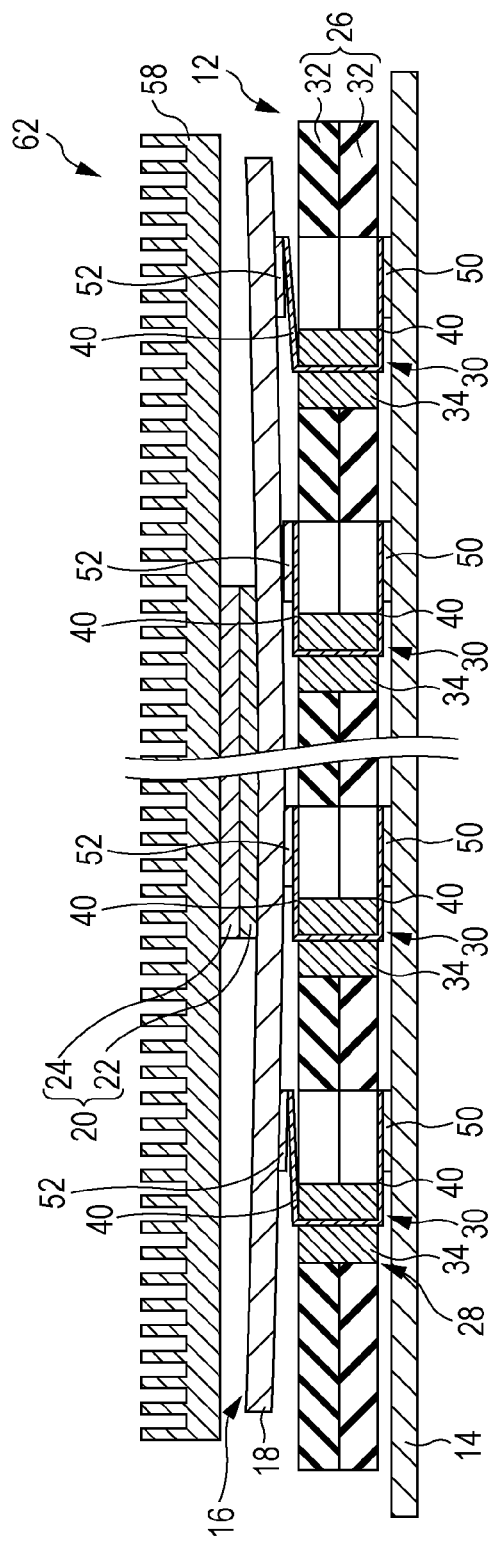
FIG. 12 is a sectional view illustrating the electronic component mounting structure of the embodiment with the electronic component warped.
Figure 13:
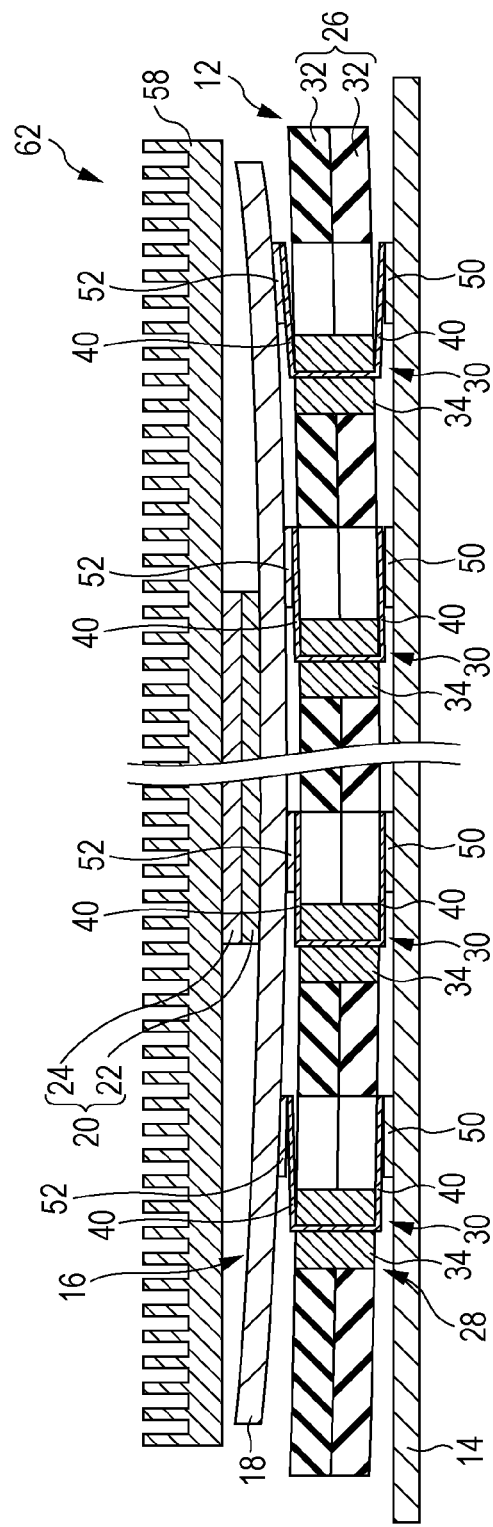
FIG. 13 is a sectional view illustrating the electronic component mounting structure of the embodiment with the electronic component warped.

As illustrated in FIG. 12, if the outer peripheral part of the package substrate 18 warps away from the board 14, the extending portions 40 of the socket 12 rises from the bottom surfaces 34B owing to the elastic reaction force, and the contact with the package substrate 18 may be maintained. In addition, as illustrated in FIG. 13, if the warpage of the package substrate 18 is significant, the outer peripheral part of the holding member 28 curves slightly toward the package substrate 18 owing to the elastic reaction force of the extending portions 40b on the board 14 side. Thus, even if the warpage of the package substrate 18 is significant, the holding member 28 follows this warpage, and the contact with the package substrate 18 may be maintained.

Although cylindrically formed block portions 34 are taken as an example above, the shape of the block portions 34 is not limited to a cylindrical shape and may be, for example, a prismatic shape or a spherical shape. However, when the block portions 34 include a cylindrical shape, their shape in plan view is a circular shape, and therefore their stiffness and strength are not dependent on direction. In addition, when the block portions 34 include a cylindrical shape, the cross-section in a direction perpendicular to the axial direction is uniform, and therefore the strength is uniform in the axial direction.

The structure of the holding member 28 is not limited to the above-described structure having the block portions 34 and the connecting portions 36. For example, a lattice-shaped holding member may be formed using only stick-like connecting portions 36, and coupling members 30 may be fixed to the intersections. In a structure having block portions 34, a large part of each coupling member 30 is fixed, and therefore more reliable fixation is possible.

Since the width W1 of the connecting portions 36 is less than the external diameter D1 of the block portions 34, large parts in which the unitary sheets 32 are in contact with each other may be secured.

The shape of the whole holding member 28 is not limited to the above-described lattice-like shape. The holding member 28 may include, for example, a shape having connecting portions that connect the block portions 34 (the coupling members 30) in an oblique direction (direction along the diagonal line DL). However, in the case of a structure in which coupling members 30 are arrayed in the horizontal direction and vertical direction at regular intervals, a lattice-shaped holding member 28 may maintain the relative positions of the coupling members 30 despite its simple shape.

The shape of the coupling members 30 is not limited to the above-described shape having an embedded portion 38 and extending portions 40 on both sides thereof. For example, a coupling member may be divided into two in the longitudinal direction, and the two coupling members 30 may be brought into contact with each other in a block portion 34. However, in the case of a structure in which a coupling member 30 includes a central embedded portion 38 and extending portions 40 on both sides thereof, the embedded portion 38 and the two extending portions 40 are integral, and therefore the number of components is small. In addition, the coupling member 30 may be easily fixed to the block portion 34.

The extending portions 40 do not include to be inclined to the upper side 26A or the lower side 26B of the sheet member 26 and, for example, may be perpendicularly erected from the upper side 26A or the lower side 26B of the sheet member 26. However, if the extending portions 40 are perpendicularly erected from the upper side 26A or the lower side 26B of the sheet member 26, the extending portions 40 may bend in an unintended direction when the socket 12 is sandwiched between the board 14 and the electronic component 16. In contrast, if the extending portions 40 are inclined to the upper side 26A or the lower side 26B of the sheet member 26, the deformation direction of the extending portions 40 (the direction in which the extending portions 40 bend) is stable when the socket 12 is sandwiched between the board 14 and the electronic component 16. In addition, when the extending portions 40 are inclined to the upper side 26A or the lower side 26B of the sheet member 26, a moderate elastic reaction force is exerted, and the contact with the package substrate 18 and the board 14 may be better maintained.

The two unitary sheets 32 do not necessarily have to be in contact with each other. That is, even if they are not in contact with each other, the heat of the electronic component 16 is diffused to the unitary sheet 32 in contact with the electronic component 16, and therefore the heat radiation effect is high compared to a socket that includes no unitary sheets 32. When the two unitary sheets 32 are in contact with each other, heat is also diffused from the unitary sheet 32 on the electronic component 16 side to the unitary sheet 32 on the board 14 side, and therefore the heat radiation effect is higher. The heat capacity of a part that contributes substantially to heat radiation of a structure in which two unitary sheets 32 are in contact with each other is larger than that of a structure in which two unitary sheet 32 are not in contact with each other.

The structure of the sheet member 26 is not limited to a structure having two unitary sheets 32. For example, the sheet member 26 may include only one unitary sheet 32. However, in the case of a single unitary sheet 32, the connecting portions 36 of the holding member 28 may not be sandwiched in the thickness direction, and therefore substantially there is no unitary sheet 32 on the board 14 side. In contrast, when the connecting portions 36 are sandwiched between two unitary sheets 32 in the thickness direction, the volume (heat capacity) of the whole sheet member 26 is large, and therefore heat is effectively diffused. From such a viewpoint, the sheet member may be formed of three or more unitary sheets. However, when three or more unitary sheets are used, the number of components increases, the number of processes for joining also increases, and therefore the manufacturing cost may increase. In a structure in which two unitary sheets 32 are used as the sheet member 26, the number of components does not increase excessively, and only a single process of joining is desired, and therefore the manufacturing cost may be reduced.

The electrical insulation property of the unitary sheets 32 is, as described above, a resistivity of 1000 MΩm or more. That is, if the resistivity is 1000 MΩm or more, conduction between the extending portions 40 may be suppressed when the extending portions 40 are in contact with the unitary sheets 32 with the board 14 and the electronic component 16 connected by the socket 12 as illustrated in FIG. 9 and FIG. 10. From such a viewpoint, the upper limit of resistivity is not particularly limited.

The thermal diffusion property of the unitary sheet 32 is, as described above, a thermal conductivity of 5 W/m·K or more. That is, if the thermal conductivity is 5 W/m·K or more, heat may be effectively radiated from the package substrate 18 of the electronic component 16 by the unitary sheets 32 when the board 14 and the electronic component 16 are connected by the socket 12 as illustrated in FIG. 9 and FIG. 10. From such a viewpoint, the upper limit of thermal conductivity is not particularly limited.

The electronic component mounted on the board 14 in the electronic component mounting structure 62 is not limited to the above-described structure, that is, a structure in which laminated components 20 (a logic circuit section 22 and a memory section 24) are stacked on a package substrate 18. In an electronic component in which laminated components 20 are stacked on a package substrate 18, circuits and various elements in the electronic component 16 are arranged three-dimensionally, and therefore a high degree of integration may be achieved. In addition, the size of the package substrate 18 may be reduced, and disadvantages such as an increase in leak current accompanied by heat generation of semiconductors, and signal delay between wires may be suppressed.

In an electronic component 16 having a structure in which laminated components 20 are stacked on a package substrate 18, disposing a heat sink 58 in contact with the laminated components 20 makes it possible to radiate heat from the laminated components 20.

The heat sink 58 may not be in contact with the part in which the laminated components 20 are stacked on the package substrate 18. However, the socket 12 is in contact with the side opposite to the laminated components 20, and therefore heat may be efficiently radiated from the package substrate 18.

Of course, when heat may be sufficiently radiated from the laminated components 20 without the heat sink 58, the heat sink 58 may be omitted.

Examples of the electronic component 16 include a land grid array (LGA) electronic component having a structure in which planar pads are arrayed in a grid on the surface of a package substrate 18. In the LGA, pads serving as electrodes are planar, and therefore the coupling members 30 of the above-described embodiment may better maintain the contact by elastic force. Particularly in the case of the LGA, if the socket 12 is housed within a frame body 54 as illustrated in FIG. 11, the contact between the coupling members 30 and the LGA may be maintained by claw portions 56. Since solder or an electrically-conductive adhesive is not used, the LGA may be easily replaced.

Examples of the electronic component 16 also include a ball grid array (BGA) electronic component in which hemispherical electrodes of solder are provided on the surface of a package substrate. In the electronic component 16, a plurality of laminated components 20 and the like do not have to be stacked on a flat plate-like package substrate 18.

Although the embodiment of the present disclosure has been described, the present disclosure is not limited to the above-described embodiment. It goes without saying that various changes may be made without departing from the spirit of the present disclosure.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A socket comprising:
    a plurality of coupling members that each include a first end portion and a second end portion, the coupling members being made of electrically conductive material, wherein a terminal of an electronic component and a terminal of a board are electrically coupled with the first end portion and the second end portion, respectively, so to electrically connect the terminal of the electronic component and the terminal of the board;
    a holding member that holds the plurality of coupling members in such a manner that the plurality of coupling members are not in contact with each other, the holding member being made from an electrical insulating material; and
    a sheet member that is in contact with the electronic component and the board between the plurality of coupling members, the sheet member being made from a material which is electrically insulating and thermally diffusive,
    wherein each of the plurality of coupling members includes an embedded portion that is embedded in the holding member, and a longitudinal direction of the embedded portion is along a direction of a normal line from one of the first end portion and the second end portion to a surface of the holding member.

2. The socket according to claim 1, wherein the holding member is formed in a lattice-shape so as to couple the plurality of coupling members in plan view of the sheet member.

3. The socket according to claim 2, wherein the holding member includes a plurality of block portions through which the plurality of coupling members pass, and connecting members that connect the plurality of block portions in a lattice-like manner.

4. The socket according to claim 3, wherein each of the plurality of block portions are formed in a cylindrical shape whose axial direction is a thickness direction of the sheet member.

5. The socket according to claim 3, wherein the embedded portion is embedded in each of the plurality of the block portions, and the coupling members each include extending portions that are continuous with both ends of the embedded portion and that extend from surfaces of each of the plurality of block portions.

6. The socket according to claim 5, wherein the extending portions are inclined to an upper side or a lower side of the sheet member.

7. The socket according to claim 5, wherein the extending portions are located at positions different from the positions of the connecting members in plan view of the sheet member.

8. The socket according to claim 1, wherein the sheet member includes a plurality of unitary sheets between which at least a part of the holding member is sandwiched in a thickness direction.

9. The socket according to claim 8, wherein the plurality of unitary sheets are partially in contact with each other in the thickness direction.

10. The socket according to claim 1, wherein the sheet member is in contact with the holding member in a thickness direction.

11. An electronic component mounting structure comprising:
    a socket including,
    a plurality of coupling members that each include a first end portion and a second end portion, the coupling members being made of electrically conductive material, wherein a terminal of an electronic component and a terminal of a board are electrically coupled with the first end portion and the second end portion, respectively, so to electrically connect the terminal of the electronic component and the terminal of the board,
    a holding member that holds the plurality of coupling members in such a manner that the plurality of coupling members are not in contact with each other, the holding member being made form an electrical insulating material, and
    a sheet member that is in contact with the electronic component and the board between the plurality of coupling members, the sheet member being made from a material which is electrical insulating and thermal diffusive,
    wherein the first end portion and the second end portion are provided on a front surface and a second surface of the sheet member, respectively,
    wherein each of the plurality of coupling members includes an embedded portion that is embedded in the holding member, and a longitudinal direction of the embedded portion is along a direction of a normal line from one of the first end portion and the second end portion to a surface of the holding member.

12. The electronic component mounting structure according to claim 11, wherein the electronic component includes a package substrate provided on a surface of the socket and a laminated component provided on a surface of the package substrate.

13. The electronic component mounting structure according to claim 12, further comprising a heat radiating member which is in contact with the laminated components so as to radiate heat from the laminated components.

14. A socket comprising:
    a plurality of coupling members that each include a first extending portion and a second extending portion, the coupling members being made of electrically conductive material, wherein a terminal of an electronic component and a terminal of a board are electrically coupled with the first extending portion and the second extending portion, respectively, so to electrically connect the terminal of the electronic component and the terminal of the board;

a holding member that includes, a plurality of block portions through which the plurality of coupling members pass, and coupling portions that connect the plurality of block portions in a lattice-like manner, wherein the holding member holds the plurality of coupling members in such a manner that the respective first and second extending portions are disposed so as to extend toward farthest ones in first extending portions and second extending portions adjust to the respective first and second extending portions in the plurality of coupling members; and a sheet member that is in contact with the electronic component and the board between the plurality of coupling members, the sheet member being made from a material which is electrical insulating and thermal diffusive, wherein each of the plurality of coupling members includes an embedded portion that is embedded in the holding member, and a longitudinal direction of the embedded portion is along a direction of a normal line from one of the first end portion and the second end portion to a surface of the holding member.

15. The socket according to claim 1, wherein each of the plurality of coupling members includes extending portions that extend from the embedded portion at an upper surface and a bottom surface of the holding member respectively to the same side with respect to the embedded portion.

16. The electronic component mounting structure according to claim 11, wherein each of the plurality of coupling members includes extending portions that extend from the embedded portion at an upper surface and a bottom surface of the holding member respectively to the same side with respect to the embedded portion.

17. The socket according to claim 14, wherein each of the plurality of coupling members includes extending portions that extend from the embedded portion at an upper surface and a bottom surface of the holding member respectively to the same side with respect to the embedded portion.

* * * * *